(12) United States Patent
Li et al.

(10) Patent No.: US 10,956,057 B2
(45) Date of Patent: Mar. 23, 2021

(54) ADAPTIVE POWER MANAGEMENT OF DYNAMIC RANDOM ACCESS MEMORY

(71) Applicant: QUALCOMM Incorporated, San Diego, CA (US)

(72) Inventors: Yanru Li, San Diego, CA (US); Dexter Tamio Chun, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 43 days.

(21) Appl. No.: 16/115,845

(22) Filed: Aug. 29, 2018

(65) Prior Publication Data

US 2020/0073561 A1 Mar. 5, 2020

(51) Int. Cl.
*G06F 3/06* (2006.01)

(52) U.S. Cl.
CPC .......... *G06F 3/0625* (2013.01); *G06F 3/0659* (2013.01); *G06F 3/0673* (2013.01)

(58) Field of Classification Search
CPC .... G06F 3/0625; G06F 3/0659; G06F 3/0673; G06F 1/3212; G06F 1/3275; G06F 1/3287; G06F 1/3234; H04W 52/0261; H04W 52/0274

See application file for complete search history.

(56) References Cited

U.S. PATENT DOCUMENTS

| | | | | |
|---|---|---|---|---|
| 6,862,238 | B1 * | 3/2005 | Lee | G11C 11/40622 365/222 |
| 2006/0123253 | A1 * | 6/2006 | Morgan | G06F 1/3228 713/300 |
| 2006/0259803 | A1 * | 11/2006 | Edwards | G06F 1/3215 713/320 |
| 2007/0049133 | A1 * | 3/2007 | Conroy | G06F 1/3203 439/894 |
| 2009/0093281 | A1 * | 4/2009 | Demirhan | H04W 52/0235 455/574 |
| 2010/0332043 | A1 * | 12/2010 | Weyland | G06F 1/3203 700/291 |
| 2011/0258367 | A1 * | 10/2011 | Tanaka | G06F 1/3275 711/103 |
| 2012/0017099 | A1 * | 1/2012 | David | G06F 1/3275 713/300 |

(Continued)

*Primary Examiner* — Charles Rones
*Assistant Examiner* — Hewy H Li
(74) *Attorney, Agent, or Firm* — Patterson & Sheridan, L.L.P.

(57) ABSTRACT

Various additional and alternative aspects are described herein. In some aspects, the present disclosure provides a method of controlling a memory of a computing device by an adaptive memory controller. The method includes collecting usage data from the computing device over a first bin, wherein the first bin is associated with a first weight, wherein the first weight is indicative of one or more of a first partial array self-refresh (PASR) setting a first partial array auto refresh (PAAR) setting and a first deep power down (DPD) setting. The method further includes associating the collected data with a second weight, adapting the first bin based on the second weight, wherein the second weight is indicative of one or more of a second PASR, PAAR, and DPD setting. The method further includes controlling the memory during the next first bin based on the second weight.

20 Claims, 5 Drawing Sheets

(56) References Cited

U.S. PATENT DOCUMENTS

| | | | |
|---|---|---|---|
| 2013/0067261 A1* | 3/2013 | Carroll | G06F 1/3203 |
| | | | 713/323 |
| 2014/0047176 A1* | 2/2014 | Poddar | G06F 1/3275 |
| | | | 711/106 |
| 2015/0351037 A1* | 12/2015 | Brown | H04W 52/0261 |
| | | | 455/574 |
| 2016/0062691 A1* | 3/2016 | Chang | G11C 11/4072 |
| | | | 713/320 |
| 2018/0293011 A1* | 10/2018 | Schluessler | G06F 3/0625 |

* cited by examiner

ADAPTIVE POWER MANAGEMENT OF DYNAMIC RANDOM ACCESS MEMORY

TECHNICAL FIELD

The teachings of the present disclosure relate generally to memory control, and in certain aspects, to adaptive power management of volatile memory.

INTRODUCTION

Computing devices are ubiquitous. Some computing devices are portable, such as mobile phones, tablets, and laptop computers. As the functionality of such portable computing devices increases, so does the processing power and data storage requirements to support such functionality. For example, a mobile phone typically functions as a cellular telephone, a still camera, a video camera, a global positioning system (GPS), a movement tracker, an internet access device, an electronic mail interface, a text messaging device, etc. Many of these portable devices have evolved to include one or more system-on-chips (SoCs) to enable a multitude of primary and peripheral functions.

A SoC generally includes multiple central processing unit (CPU) cores embedded in an integrated circuit or chip and coupled by a local bus. The CPU cores may further be arranged into one or more computing clusters. The SoC may further include certain memory for greater functionality, for example, dynamic random access memory (DRAM), such as double data rate (DDR) synchronous DRAM (SDRAM), low power DDR (LPDDR), etc.). The memory may be stacked with the SoC, configured as a package on package design, or completely external (e.g., not on the same package as the SoC).

DRAM is a volatile memory, meaning that as soon as data is written to a data cell the data begins to disappear as the stored charge (data) decays over time. To prevent data loss, a DRAM controller refreshes the DRAM data by first reading the data cell and then rewriting the data for each and every data cell. The refresh rate in volatile memory should be often enough that no data is lost between each refresh, but not so often that unnecessary energy is expended by unnecessary refreshing. Often, the refresh rate is set conservatively to prevent data loss in all scenarios, for example setting the interval short enough to prevent data loss in fast decaying data cells operating at excessive temperatures, as excessive temperatures are known to speed data cell decay. However, setting refresh settings to a short interval can result in excessive energy expended on reading and writing the data cells, which reduces battery life and overall efficiency.

Existing DRAM power saving technology includes features such as partial array self-refresh (PASR), partial array auto-refresh (PAAR), and deep power down (DPD). PASR is a memory control technology that can selectively refresh certain data cells, which saves energy by not refreshing certain data cells. For example, consider a DRAM with PASR for controlling a memory array that includes a number of banks of cells, and each bank of cells may include a number of segments (e.g., groups of cells within a single bank). PASR may be used to control which of the banks of cells or segments within those banks of cells are refreshed or not refreshed. In certain aspects, PASR registers are manipulated by a memory controller to control which banks of cells, and which segments within each bank of cells, should be refreshed at a given time. It will be appreciated that in accordance with certain aspects of the disclosure, PASR may be dynamically adjusted. Similar to PASR, PAAR selectively refreshes certain banks or segments. In certain aspects, PASR is employed during self-refresh state of DRAM operation, whereas PAAR is employed during auto-refresh state of DRAM operation. DPD is a memory control technology that can minimize memory power consumption by shutting down the internal power supply to the memory, which suspends refresh operations (e.g., rank or chip select granularity).

Together, PASR, PAAR, and DPD can increase efficiency when employed in accordance with certain aspects of the disclosure. It will be appreciated that PASR, PAAR, and DPD do not come without cost. To retain certain data, PASR, PAAR, and DPD can clear out data stored in a data cell using an operating system (OS) before powering down the data cell. This, however, involves a considerable amount of energy in the form of subtasks running on the CPU and using compute cycles of the CPU, which expends energy. Therefore, PASR, PAAR, and DPD cost energy to execute. Thus, there is a balance between the energy savings and the energy costs of using PASR, PAAR, and DPD. For example, if PASR, PAAR, and DPD are engaged too frequently, the power expended running subtasks running on the CPU can exceed the energy savings gained through PASR, PAAR, and DPD and degrade performance. On the other hand, if PASR, PAAR, and DPD are not used frequently enough, then volatile memory (e.g., DRAM, etc.) will continue to consume excess power, which can degrade battery life and system components.

In certain aspects, a user equipment (UE) may contain static PASR, PAAR, and DPD settings (e.g., shutting off half of the available banks with DPD, and only refreshing half of the remaining segments with PASR or PAAR between the hours of 11 P.M. and 6 A.M. while leaving the memory at full power for the remainder of the day). The problem with a static PASR, PAAR, and DPD settings is they often do not result in optimal power savings. For example, if PASR, PAAR, and DPD settings aggressively shut down data cells after 11 P.M., a user who uses their device at night (e.g., after 11 P.M.) may find their device in a suboptimal state and expending excessive energy from clearing and restoring data cells. Accordingly, techniques for adaptive power management of volatile memory, such as DRAM, are desirable for improved computing device performance.

BRIEF SUMMARY OF SOME EXAMPLES

The following presents a simplified summary to provide a basic understanding of certain aspects of the present disclosure. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

In some aspects, the present disclosure provides a method of controlling a memory of a computing device by an adaptive memory controller. The method includes collecting usage data from the computing device over a first bin, wherein the first bin is associated with a first weight, wherein the first weight is indicative of a first partial array self-refresh (PASR) setting, a first partial array auto refresh (PAAR) setting, and/or a first deep power down (DPD) setting. The method further includes associating the collected data with a second weight. The method further includes adapting the first bin based on the second weight, wherein the second weight is indicative of a second PASR setting, a second PAAR setting, and/or a second DPD setting. The method further includes controlling the memory during the next first bin based on the second weight.

In some aspects, the present disclosure provides a circuit. The circuit includes a processor, a memory; and at least one sensor. The circuit further includes an adaptive memory controller configured to perform a method of controlling memory. The method includes collecting usage data from the computing device over a first bin, wherein the first bin is associated with a first weight, wherein the first weight is indicative of a first partial array self-refresh (PASR) setting, a first partial array auto refresh (PAAR) setting, and/or a first deep power down (DPD). The method further includes associating the collected data with a second weight. The method further includes adapting the first bin based on the second weight, wherein the second weight is indicative of a second PASR setting, a second PAAR setting, and/or a second deep power down (DPD) setting. The method further includes controlling the memory during the next first bin based on the second weight.

In some aspects, the present disclosure provides a circuit. The circuit includes means for controlling a memory coupled to a system on chip (SoC) by an adaptive memory controller. The circuit further includes a means for collecting usage data from the computing device over a first bin, wherein the first bin is associated with a first weight, wherein the first weight is indicative of a first partial array self-refresh (PASR) setting, a first partial array auto refresh (PAAR) setting, and/or a first deep power down (DPD). The circuit further includes a means for associating the collected data with a second weight. The circuit further includes a means for adapting the first bin based on the second weight, wherein the second weight is indicative of a second PASR setting, a second PAAR setting, and/or a second DPD setting. The circuit further includes a means for controlling the memory during the next first bin based on the second weight.

In certain aspects the disclosure provides a method of controlling a memory of a computing device by an adaptive memory controller. The method includes collecting a first data set from the computing device over a period of time. The method further includes processing the collected data with a neural network. The method further includes generating at least one bin based on the first data set, wherein the at least one bin is associated with a first weight, wherein the first weight is indicative of a first partial array self-refresh (PASR) setting, a first partial array auto refresh (PAAR) setting, and/or a first deep power down (DPD) setting. The method further includes controlling the memory based on the at least one bin In some aspects, the present disclosure provides a non-transitory medium having instructions stored thereon for causing a circuit to perform the methods disclosed herein.

These and other aspects of the invention will become more fully understood upon a review of the detailed description, which follows. Other aspects, features, and embodiments of the present invention will become apparent to those of ordinary skill in the art, upon reviewing the following description of specific, exemplary embodiments of the present invention in conjunction with the accompanying figures. While features of the present invention may be discussed relative to certain embodiments and figures below, all embodiments of the present invention can include one or more of the advantageous features discussed herein. In other words, while one or more embodiments may be discussed as having certain advantageous features, one or more of such features may also be used in accordance with the various embodiments of the invention discussed herein. In similar fashion, while exemplary embodiments may be discussed below as device, system, or method embodiments it should be understood that such exemplary embodiments can be implemented in various devices, systems, and methods.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain aspects of this disclosure and are therefore not to be considered limiting of its scope, for the description may admit to other equally effective aspects.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Although the teachings of this disclosure are illustrated in terms of integrated circuits (e.g., a SoC), the teachings are applicable in other areas and to other types of computing devices coupled locally or remotely to memory. The teachings disclosed should not be construed to be limited to SoC designs or the illustrated embodiments. The illustrated embodiments are merely vehicles to describe and illustrate examples of the inventive teachings disclosed herein. Further, although the certain techniques are related to adaptive power management of dynamic random access memory DRAM coupled to a SoC, the disclosure should not be seen as strictly limited to a SoC configuration or memory type.

Figure 1:
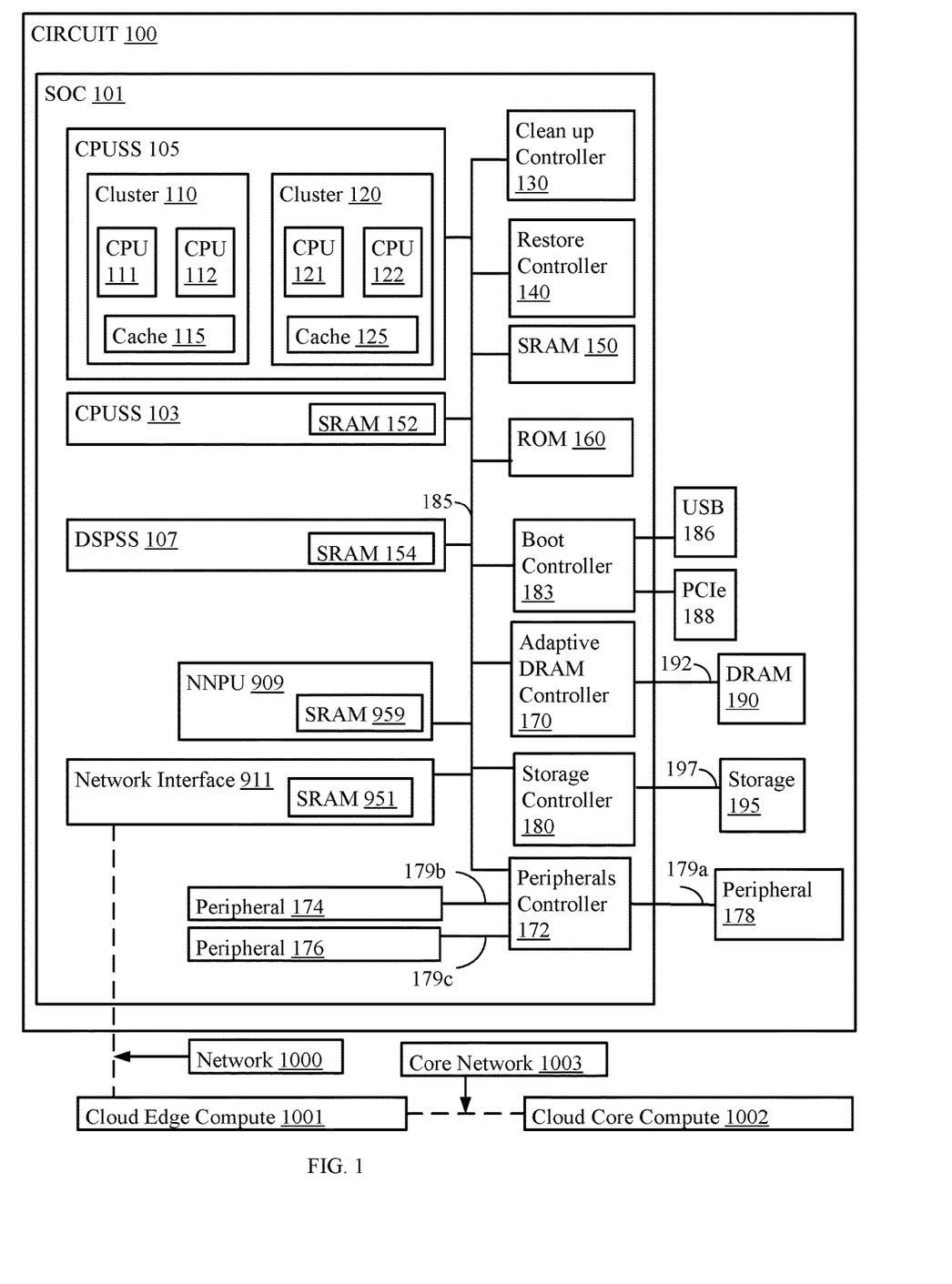
FIG. 1 is a simplified schematic diagram of an exemplary circuit, in accordance with certain aspects of the present disclosure.

FIG. 1 is a simplified schematic diagram of an exemplary circuit 100, in accordance with certain aspects of the present disclosure. For example, circuit 100 may correspond to a chip, board, or other circuit. Circuit 100 includes SoC 101 and in certain aspects, circuit 100 may be referred to as a SoC comprising one or more integrated SoCs. Though circuit 100 is shown as including one SoC, it is apparent to one of ordinary skill in the art that circuit 100 may include more than one SoC. Peripheral controller 172 may be stacked with the SoC 101, may be configured as a package on package design, may be completely external (e.g., not on the same package as the SoC 101), etc. The peripheral controller 172 is coupled to peripheral 178 (e.g., off-chip) by a bus 179*a*. Peripheral controller 172 is further coupled to peripheral 174 (e.g., on-chip) through bus 179*b*, and peripheral 176 though bus 179*c*. As non-limiting examples, peripheral 174, peripheral 176, and peripheral 178 may be sensors (e.g., a global positioning sensor (GPS), an accelerometer, a battery sensor, a temperature sensor, a capacitive touch sensor, an image sensor, etc.) located on-chip or off chip (e.g., through peripheral component interconnect express (PCIe) interface, universal serial bus (USB) interface, serial peripheral interface (SPI), Bluetooth, WiFi, or other suitable means etc.). In certain aspects, Bluetooth, WiFi, and other wireless technologies may be referred to as a sensor, as they may be used in part to determine information, for example, location, movement, screen activity, etc.

As shown, SoC 101 includes a CPU sub-system (CPUSS) 105. The CPUSS 105 includes a plurality of CPU cores 111, 112, 121, and 122. Though CPUSS 105 is shown with a particular number of CPU cores, it should be noted that there may be additional or fewer cores in CPUSS 105. Further, CPU cores 111 and 112 are part of a cluster 110, and CPU cores 121 and 122 are part of a cluster 120. Although shown with a particular number of CPU clusters, CPUSS 105 may include additional or fewer clusters. Further, each cluster may include the same or a different number of CPU cores. The CPU cores 111, 112, 121, and 122 may be of the same type, or may be of different types (e.g., ARM design, non-ARM design, etc.). Further, the CPU cores of a given cluster (e.g., CPU cluster 110 or 120) may be of the same type, or may be of different types (e.g., in-cluster big-.LITTLE design, cluster based big.LITTLE design, etc.). A big.LITTLE design may refer to a computing architecture that includes low power, slower processor cores (e.g., LITTLE) that can provide battery-savings along with high power, faster processor cores (e.g., big) to provide better processing performance.

Further, the CPUSS 105 may include CPU resources, such as one or more caches. As shown, each cluster 110 and 120 includes a cache 115 and 125, respectively. In certain aspects, the CPU cores of the clusters 110 and 120 may share the cache 115 and 125, respectively, for memory storage. It should be noted that the CPUSS 105 may include additional or different CPU resources than those shown. For example, in some aspects, one or more CPU cores may have its own associated cache, one or more clusters may have its own associated cache (e.g., shared by CPU cores of the cluster), and/or the CPUSS 105 may include one or more caches shared by one or more clusters and/or CPU cores. The SoC 101 further may include additional CPUSS 103, and a digital signal processor sub-system (DSPSS) such as DSPSS 107. In certain aspects, each of CPUSS 103 and DSPSS 107 may have its own SRAM 152, and 154, respectively, functioning as (e.g., in lieu of) a cache for reading and writing data.

SoC 101 further may include neural network processor unit (NNPU) 909. In certain aspects, NNPU 909 may have its own memory, (e.g., static random access memory (SRAM) 959), functioning as (e.g., in lieu of) a cache for reading and writing data. The SoC 101 further may include network interface 911. In certain aspects, network interface 911 may have its own (e.g., static random access memory SRAM 951), functioning as (e.g., in lieu of) a cache for reading and writing data. Network interface 911 may connect to a network 1000, allowing SoC 101 to communicate with one or more remote devices (e.g., cloud based devises) such as cloud edge compute 1001 which may include processing capability, connected via the core network 1003 to a cloud core compute 1002. Cloud core compute 1002 may include processing capabilities. In certain aspects, network 1000 may be a wired network, and in other aspects, network 1000 is a wireless network.

As shown in FIG. 1, SoC 101 further includes a clean-up controller 130, a restore controller 140, static random-access memory (SRAM) 150, a read only memory (ROM) 160, an adaptive DRAM controller 170, a storage controller 180, boot interface (I/F) controller 183, and peripheral controller 172, which are all shown as internal (e.g., on-chip) components of SoC 101. The internal components of the SoC 101 are coupled together by a bus 185. Further, the adaptive DRAM controller 170 is coupled to a DRAM 190, which is external (e.g., off-chip) to SoC 101, by a bus 192. A physical implementation of the DRAM 190 may be stacked with SoC 101, may be configured as a package on package design, or may be completely external (e.g., not on the same package as SoC 101). The storage controller 180 is coupled to a storage 195 (e.g., flash storage) external (e.g., off-chip) to SoC 101 by a bus 197. The SRAM 150, DRAM 190, and storage 195 may provide additional storage capacity for SoC 101.

Adaptive DRAM controller 170 is configured to adaptively control memory by adapting PASR, PAAR, and DPD settings (e.g., to provide net power benefits) which may include longer battery life (e.g., smartphone, laptop, mobile device. etc.) and better performance (e.g., lower latency). Because PASR, PAAR, and DPD settings can control the refreshing of memory cells (e.g., in the DRAM 190), any DRAM cells within a bank or segment that are currently in use (e.g., containing data) should first be cleared before turning off refresh for that bank or segment. If a bank or segment was turned off, any programs using data in that bank or segment may encounter corrupted data. In certain aspects, a clean up of the bank or segment is done first to retain the data. In certain aspects, this is performed via the operating system since the operating system can track memory usage. For example, it will be appreciated that the operating system can track memory utilization (e.g., tracking a page frame (e.g., a 4096 byte page frame)). In certain aspects, the operating system can track every page frame in the entire memory. For example, if the memory is 4 gigabytes, then the operating system will track 1048576 page frames. If any bit within a 4096 byte page frame is currently used, then that page frame can be marked "active." In certain aspects, prior to turning off refresh for any portion of banks or segments, it is preferred that the entire memory space be no longer be active (e.g., through clean up). The operating system can perform this clean up, for example, by moving the data to another location (e.g., to a memory location that will remain refreshed), by halting one or more programs that are using a portion of the targeted memory location, etc. In certain aspects, the operating system running on the CPUSS 105 performs clean up and restore of memory (e.g., directly or indirectly). In certain aspects, clean up controller 130 and restore controller 140 perform functions such as data copy under the control of the operating system and are used by adaptive DRAM controller 170 to implement certain aspects of memory power settings such as issuing refresh state-change bank-change or segment-change commands to the DRAM. In other aspects, the functions of clean up controller 130 and restore controller 140 are integrated into adaptive DRAM controller 170.

In certain aspects, adaptive DRAM controller 170 contains static PASR, PAAR, and DPD settings in SoC 101. For example when a user purchases a new computing device (e.g., smart phone), it may be configured with a static PASR and DPD setting that aggressively engages PASR and DPD (e.g., powering down half of the memory) at a predetermined time (e.g., a time associated with low use by a typical consumer (e.g., 11 P.M. and 7 A.M.)). In certain aspects, static PASR, PAAR, and DPD settings may indicate that PASR, PAAR, and DPD are not used, (e.g., during hours associated with high use by a typical consumer (e.g., 7 A.M. and 11 P.M.)). It will be appreciated that in certain aspects, adaptive DRAM controller 170 may be configured with a static PASR, PAAR, and DPD settings that always engage PASR, PAAR, and DPD, never engage PASR, PAAR, and DPD, or any iteration in between without deviating from the scope of the disclosure.

In certain aspects, adaptive DRAM controller 170 is a dynamic memory controller that can dynamically change PASR, PAAR, and DPD settings in real time, or substantially in real time. In certain aspects, adaptive DRAM controller 170 is configured to collect usage data from circuit 100 (e.g., memory information, sensor information, application use, etc.) over time and dynamically change PASR, PAAR, and DPD settings for improved performance and/or power savings based at least in part on the collected data. For example, a first user may ride a train every morning and actively use circuit 100 (e.g., a computing device such as a smart phone including circuit 100) to access the internet or play video games. In contrast, a second user using a second circuit 100 may also commute every morning, but the second user may never touch their computing device during their trip. In these cases, the first user's behavior during a morning commute is indicative of high memory activity, and the second user behavior is indicative of low memory activity. It will be appreciated that the first user and the second user may benefit from different PASR, PAAR, and DPD settings during their morning commute for improved performance and efficiency. In certain aspects, adaptive DRAM controller 170 will dynamically adapt PASR, PAAR, and DPD settings for the first user (e.g., deactivate PASR, PAAR, and DPD) and dynamically adapt PASR, PAAR, and DPD settings for the second user (e.g., activate PASR, PAAR, and DPD) for improved performance and efficiency.

PASR, PAAR, and DPD settings may correlate to a weight. In certain aspects, PASR, PAAR, and DPD settings may be stored (e.g., in a lookup table, an algorithm, etc.) that maps a weight to the PASR, PAAR, and DPD settings. In certain aspects, PAAR and PASR banks and segments are matched in order to provide the greatest power savings (e.g., PAAR bank and segment settings match the PASR bank and segment settings). In certain aspects, the higher the numerical weight the more aggressive the PASR, PAAR, and DPD settings. As a non-limiting example, a first DRAM may contain 2 banks, each with 8 segments, and a weight may be indicative of PASR, PAAR, and DPD settings as follows: a weight of 16 indicates powering down all 16 segments (i.e., both banks) using DPD; a weight of 8 indicates to powering down 8 segments (e.g., a combination of segments adding to 8 segments using PASR and/or PAAR); a weight of 6 indicates powering down 6 segments using PASR and/or PAAR (e.g., one bank at full power, the second bank with 6 segments not being refreshed); a weight of 0 indicates full power for both banks.

Adaptive DRAM controller 170 is configured to collect usage data from circuit 100 over periods of time (or bins) (e.g., periodic hour intervals) and associate a weight with each bin. It will be appreciated that in certain aspects, the range of weights may be based off the number of available PASR, PAAR, and/or DPD settings. For example, adaptive DRAM controller 170 may associate a weight from the range 0-6 to each bin when there are 6 available PASR, PAAR and/or DPD settings. It will be appreciated that any number of bins (i.e., time periods) may be used and any number of weights may be used. It will be further appreciated that more than one bin may have the same weight. For example, if a mobile device is segmented into 24 bins (e.g., one bin per hour), and a user is asleep from 11 P.M. to 7 A.M. then the 8 bins corresponding to 11 P.M. to 7 A.M may have the save weight (e.g., a weight indicative of the most aggressive memory power setting (e.g., a weight of 6 when the weight range is 0-6).

In certain aspects, adaptive DRAM controller 170 may associate a bin with a weight based on data collected from circuit 100. For example, adaptive DRAM controller 170 may collect data over a first bin (e.g., a one hour time period (e.g., 1 A.M. to 2 A.M.)) and associate the bin with a first weight, which may be indicative of a "sleep state," and is characterized by low memory usage and little to no processor activity for long periods of time (e.g., greater than about 3 hours). In certain aspects, the first weight is indicative of maximum PASR, PAAR, and DPD settings available for a given memory configuration (e.g., shutting down as many banks and segments as possible). Thus, the next day when circuit 100 enters the first bin, (1 A.M. to 2 A.M.) the circuit 100 will use PASR, PAAR, and DPD settings indicated by the first weight.

In certain aspects, adaptive DRAM controller 170 may collect data over a second bin and associate the second bin with a second weight, which may be and idle state characterized by inactive periods of about an hour to several hours (e.g., based in part on an accelerometer or GPS registering no movement over a set period of time). In certain aspects, the second weight is indicative of aggressive PASR, PAAR, and DPD settings when the second weight is associated with a bin.

In certain aspects, adaptive DRAM controller 170 may collect data over a third bin and associate the third bin with a third weight. The third weight is associated with a bin when there is light activity and small memory usage, which typically occurs, for example, during operations such as using an e-reader, audio playback, or other situation where there is some idle time, but only a small memory footprint is needed to handle the tasks. In certain aspects, the third weight is indicative of moderate PASR, PAAR, and DPD settings when the third weight is associated with a bin.

In certain aspects, adaptive DRAM controller 170 may collect data over a fourth bin and associate the fourth bin with a fourth weight. The fourth weight is associated with a bin when there is light activity and large memory usage, which typically occurs during the use of social media platforms, web browsing, messaging systems, email, photography, etc., and may be magnified by casual multi-tasking between several programs. A computing device, for example, may experience some idle time, but idle time is generally not significant. In certain aspects, the fourth weight is indicative of sparing PASR, PAAR, and DPD settings when the fourth weight is associated with a bin.

In certain aspects, adaptive DRAM controller 170 may collect data over a fifth bin and associate the fifth bin with a fifth weight. The fifth weight is associated with a bin when there is high activity and small memory usage, which typically occurs when there is heavy processor activity for a limited set of applications, such as during the use of certain games or stand-alone benchmark testing with little to no idle time. In certain aspects, the fifth weight is indicative of minimal PASR, PAAR, and DPD settings when the fifth weight is associated with a bin.

In certain aspects, adaptive DRAM controller 170 may collect data over a sixth bin and associate the sixth bin with a sixth weight. The sixth weight is associated with a bin when there is high activity and large memory usage, which typically occurs when there is heavy processor activity for a multiple applications, such as concurrently playing games, recording hi-resolution video, or rendering large graphics with little to no idle time. In certain aspects, the sixth weight is indicative of minimum PASR, PAAR, and DPD settings (e.g., not using PASR, PAAR, and DPD) when the when the sixth weight is associated with a bin.

Figure 2:
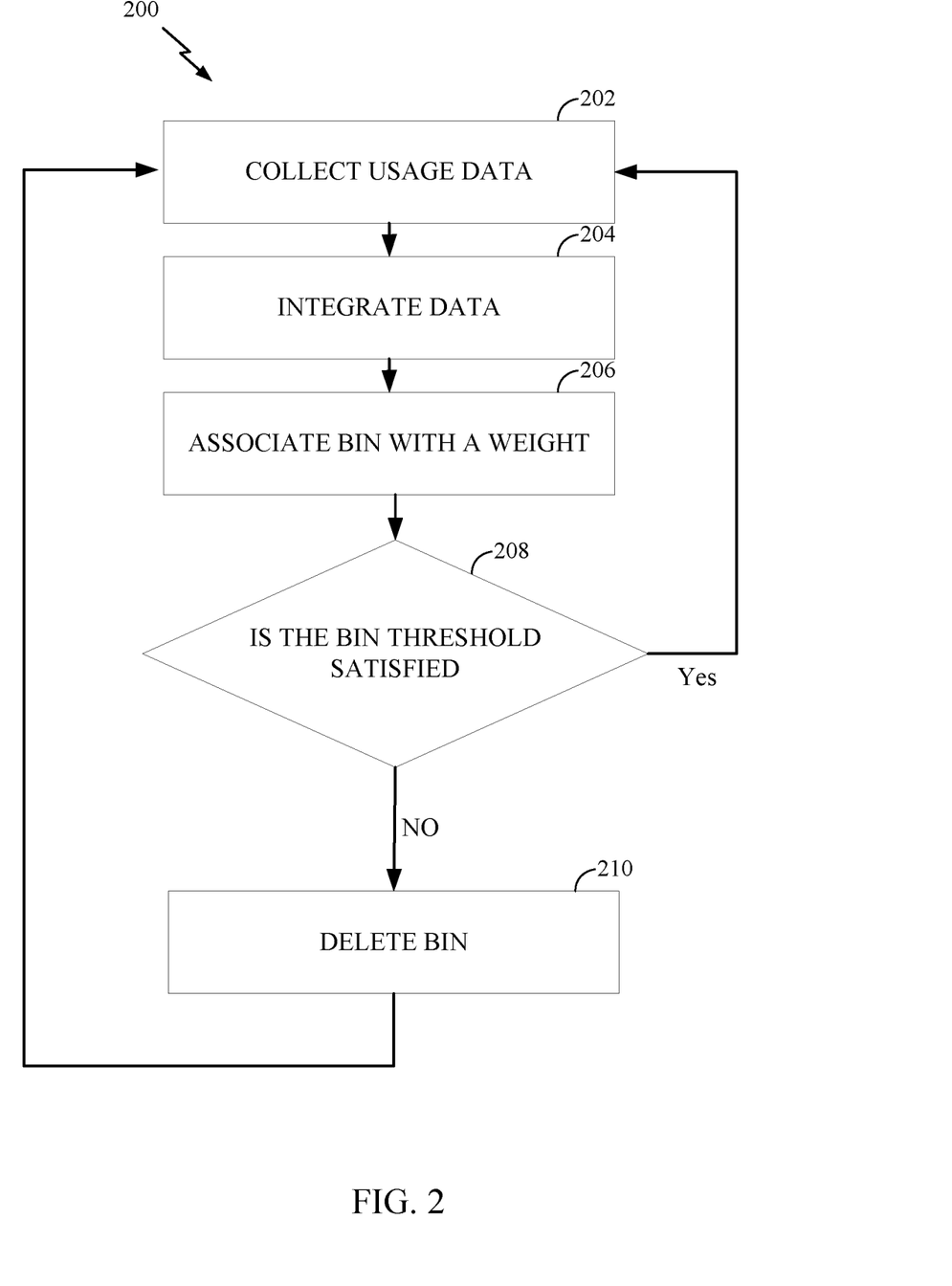
FIG. 2 is a flow chart that illustrates example operations of adaptively controlling a memory, in accordance with certain aspects of the present disclosure.

FIG. 2 is a flow chart that illustrates example operations 200 for a first mode (or setup mode) in accordance with certain aspects of the present disclosure. The operations of FIG. 2 may be performed by circuit 100 in FIG. 1, or another suitable circuit. It will be appreciated that in certain aspects, a computing device may not have weights associated with bins before entering the setup mode.

At block 202, adaptive DRAM controller 170 is configured to collect usage data (e.g., data from circuit 100 in FIG. 1) over a period of time (i.e., a bin). For example, adaptive DRAM controller 170 may collect memory usage information, sensor information, application information, etc. over a period of one hour. As described previously, in certain aspects, an operating system can track memory usage information. Memory usage information may include average memory usage, peak memory usage, minimum memory usage, etc. Sensor information may include information form one or more sensors (e.g., location based on a GPS, movement based on an accelerometer, computing device status information (e.g., battery status), environment (e.g., based on a temperature sensor), activity information (e.g., based on a capacitive touch sensor, an image sensor, etc.) etc.)). Application information may include what application is being used, how many applications are being used, etc. It will be appreciated that in certain aspects, only memory information is used. In other aspects, only sensor information or application information is used. In yet other aspects memory information, sensor information, and application information are used. For example the memory information may be indicative of sleep, however, the sensor information may be indicative that the computing device is currently moving (e.g., a person may be walking to work), and thus it may be desirable to associate a different weight based on data indicative of low memory usage with heavy movement compared to low memory usage with no movement.

At block 204, adaptive DRAM controller 170 is configured to integrate the data collected at block 202. In certain aspects, integrating the data includes averaging the data over the bin. In certain aspects, additional filtering may be applied (e.g., to remove outlier data). In other aspects, no filtering is applied.

At block 206, the integrated data is associated with a weight. For example, if the data integrated at block 204 is indicative of low power use over a first bin (e.g., 1 A.M. to 2 A.M.) a weight indicative of low power use is associated with the first bin (e.g., a weight indicative of maximum PASR, PAAR, and DPD settings available for a given memory configuration (e.g., shutting down as many banks and segments as possible)). It will be appreciated that a computing device may not have defined bins before entering the setup mode, and thus at block 206, the associating a bin with a weight includes generating the bin and associating the generated bin with a weight. It will be further appreciated that in certain aspects, when the bin is a one hour bin, after a 24 hour period, 24 bins are generated and each of the 24 bins are associated with a weight. In certain aspects, the operations end at block 206 after generating bins for an entire 24 hour period. It will be appreciated that any granularity of bin may be used (e.g., 10 minutes, 1 hour, 4 hours, 12 hours, 24 hours, etc.).

At block 208, adaptive DRAM controller 170 determines if one or more bins added at block 206 satisfies a threshold. The threshold at block 208 can be a frequency threshold (e.g., recurrence of a bin/weight over a period of days). For example, adaptive DRAM controller 170 can compare one or more bins generated at block 206 with data collected over an associated bin (e.g., compare the weight of a 1 hour bin associated with a 7 A.M. to 8 A.M. time window to a weight associated with data collected and integrated over a subsequent 7 A.M. to 8 A.M. time window (e.g., the following day)). In certain aspects, when the weight of a bin is the same as the weight of an associated bin, the operations return to block 202. In other aspects, when the weight of a bin is not the same as the weight of an associated bin, the bin is deleted. For example, on a first day, adaptive DRAM controller 170 may generated a first group of bins including 4 consecutive bins with a first weight indicative of low activity, followed by single bin with a second weight indicative of high activity, followed by 3 consecutive bins with the first weight indicative of low activity. At block 208, on a second day, adaptive DRAM controller 170 can determine that the weight of a bin associated with the single bin with a second weight indicative of high activity is associated with a first weight indicative of low activity and thus delete the bin as the bin did not satisfy the threshold (i.e., the single bin with a second weight indicative of high activity did not recur within the threshold (e.g., 2 days)).

Thus, after the bin is deleted, adaptive DRAM controller 170 returns to block 202, where in certain aspects a new bin is generated in place of the deleted bin. It will be appreciated that when the bin is deleted, there may be no weight indicative of PASR, PAAR, and DPD settings during the time period indicated by the bin. In other aspects, the deleted bin is merged (e.g., the single bin with a second weight indicative of high activity in the example above may be merged with the preceding 4 consecutive bins with a first weight indicative of low activity and/or the trailing 3 consecutive bins with the first weight indicative of low activity). Thus, it will be appreciated that the bin size may change at block 208. For example, on a first day, 24 one hour bins may be generated and each bin may be associated with a separate weight indicative of PASR, PAAR, and DPD settings (e.g., 24 weights). Then, after a 3 day adaptation period, only 4 bins remain because 20 of the bins did not satisfy the threshold (e.g., were not repeated over the three day adaptation period). In this case, a first bin may be associated with a user's morning commute and spans 1 hour, a second bin may be associated with a user's work and spans 8 hours, a third bin may be associated with after work leisure and spans 7 hours, and a fourth bin may be associated with sleep and spans 8 hours. Thus, adaptive DRAM controller 170 will control PASR, PAAR, and DPD settings based on the weight associated with each of the 4 bins. It will be appreciated that using a threshold can remove a bin that was generated using non-routine usage data collected during a time period (e.g., a late night visit to the emergency room with heavy computing device use). In certain aspects, the setup mode may be reset (e.g., all bins deleted), changed (e.g., changing the starting bin time period duration), threshold modified (e.g., changing an adaptation period) at any given time, which may be useful when a computing device is used by a different user, a user is starting a new routine, etc.

Figure 3:
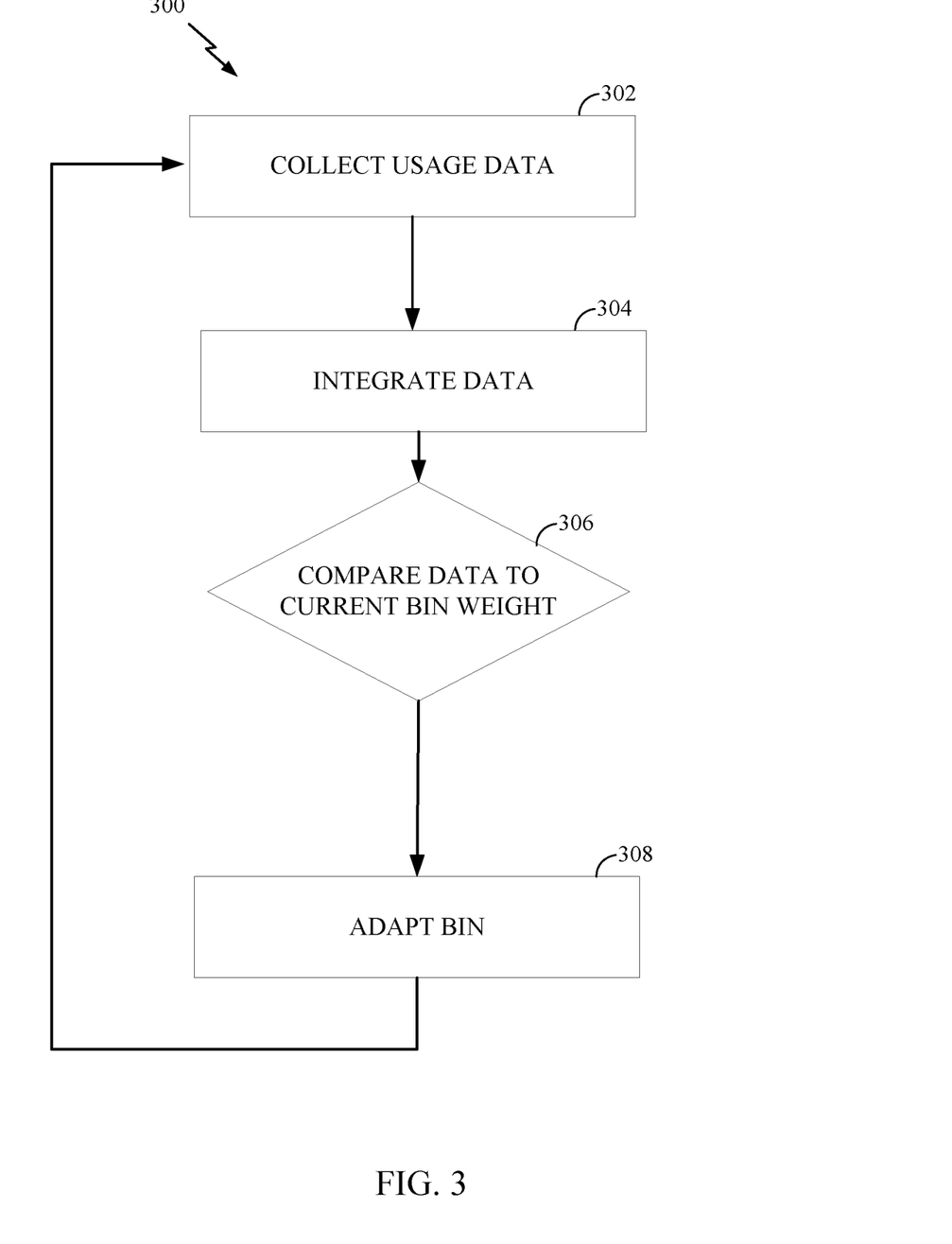
FIG. 3 is a flow chart that illustrates example operations for adaptively controlling a memory in accordance with certain aspects of the present disclosure.

FIG. 3 is a flow chart illustrating operations 300 for a second mode (or mission mode) in accordance with certain aspects of the present disclosure. In certain aspects, mission mode is used to adapt bins (e.g., bins generated in operations 200 in FIG. 2).

At block 302, adaptive DRAM controller 170 is configured to collect usage data (e.g., data from circuit 100 in FIG. 1) over a period of time (i.e., a bin). For example, adaptive DRAM controller 170 may collect memory usage information and sensor information over a period of time that is the same as a current bin (e.g., which may be configured (e.g., 1 hour bins) or dynamically adjusted though merger as set forth above (e.g., one 8 hour bin associated with one weight for the 8 hours associated with sleep)).

At block 304, adaptive DRAM controller 170 is configured to integrate the data collected at block 302. In certain aspects, integrating the data includes averaging the data over the period of time. In certain aspects, additional filtering may be applied (e.g., to remove outlier data). In other aspects, no filtering is applied.

At block 306, adaptive DRAM controller 170 compares the data integrated at block 304 to the current bin. In certain aspects, if the current bin is indicative of high memory usage, but the integrated data at block 304 is indicative of low memory usage, then at block 308, adaptive DRAM controller 170 adapts the current bin (e.g., by changing the weight of the current bin from a first weight indicative of high memory usage to a second weight indicative of low memory usage). Thus in this example, adaptive DRAM controller 170 will then use PASR, PAAR, and DPD settings for low memory usage the next time the computing device enters that bin (i.e., the next day at the same time).

For example, if a user never used their computing device on their morning commute in the past, but now uses their computing device with high activity and large memory usage during the same time period, adaptive DRAM controller 170 can associate a new weight indicative of high activity and large memory usage PASR and DPD settings.

Figure 4:
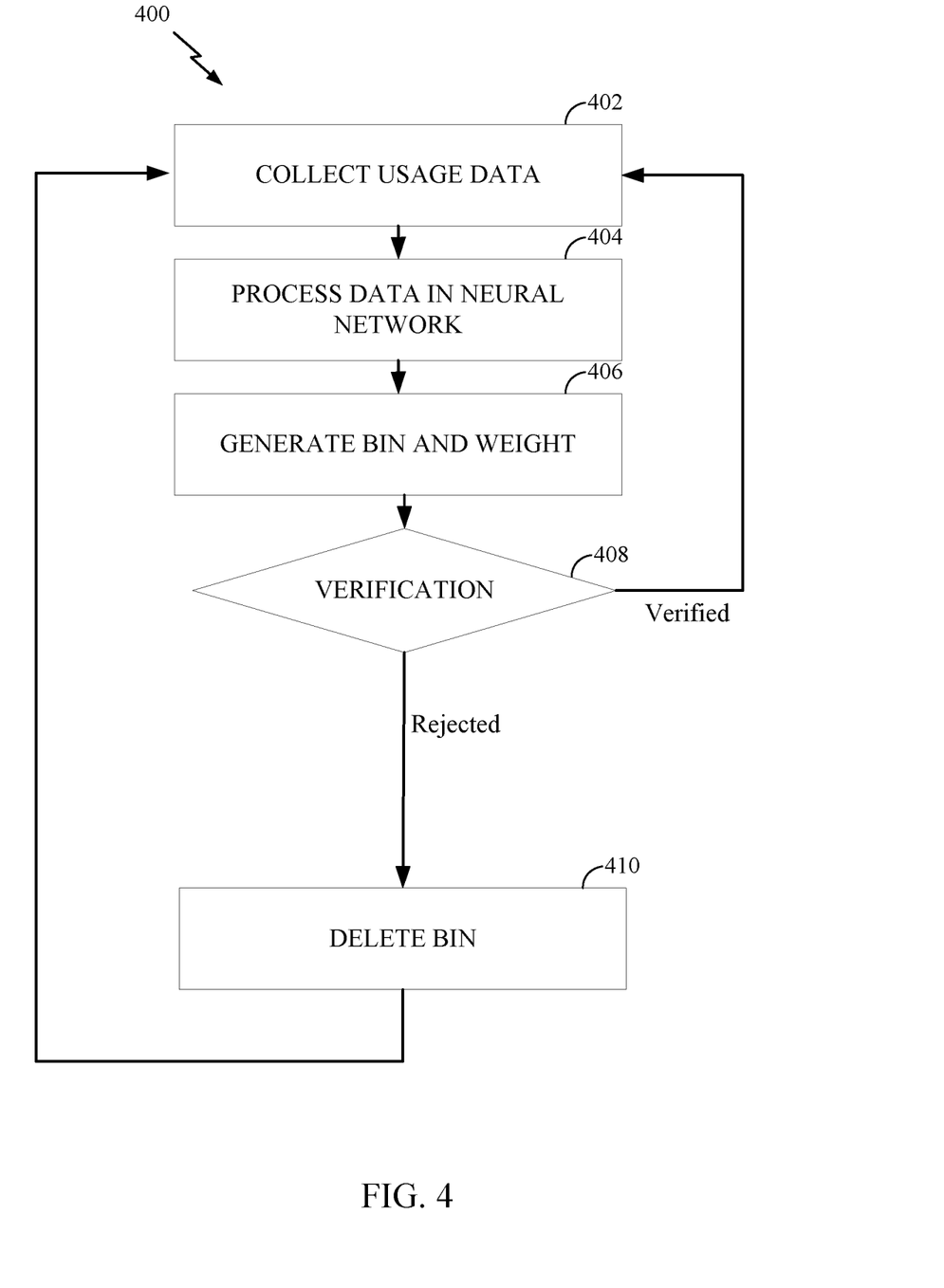
FIG. 4 is a flow chart that illustrates example operations for adaptively controlling a memory, in accordance with certain aspects of the present disclosure.

In certain aspects, adaptive DRAM controller 170 can use a neural network to generate bins. For example, FIG. 4 is a flow chart that illustrates operations 400 for a neural network process in accordance with certain aspects of the present disclosure. The operations of FIG. 4 may be performed by circuit 100 in FIG. 1, or another suitable circuit.

At block 402, adaptive DRAM controller 170 is configured to collect usage data over a period of time (e.g. a day or several days). At block 404, the data is processed through a neural network (e.g., using known convolutional neural network (CNN) processing techniques (e.g., gradient descent, Newton's method, conjugant gradient, Quasi-Newtonian, least-squares, etc.)) to generate neural network information. In general, neural network processing techniques use sets of data (e.g., usage data) and determine information based on the sets of data. For example, neural network processing techniques may be able to determine optimal bin length and bin numbers to yield power savings. In certain aspects, processing may be performed by one or more of processor such as the CPUSS 105 or DSPSS 107, a dedicated NNPU (e.g., NNPU 909), a remote compute server such as cloud edge compute 1001, a cloud core compute 1002, or other suitable local or remote device capable of performing computations. For example, certain operations in the present disclosure may be accelerated using a NNPU (e.g., NNPU 909). However, it will be appreciated that in certain aspects, data collected (e.g., memory usage, sensor information, and/or application information, etc.) may not have high resolution (e.g., low sampling rates), thus in certain aspects, the data is processed locally or remotely without accelerating (e.g., with an NNPU). In certain aspects, when NNPU 909 is employed, the decision making (e.g., comparing a weight against a threshold and other control functions) may still be tasked to another CPU (e.g., CPUSS 105). Computation and processing (e.g., operations 200, 300, 400, and/or 500) may be partitioned between the CPUSS 105, DSPSS 107, NNPU 909, cloud edge compute 1001, and cloud core compute 1002 (e.g., to achieve desired performance (e.g., low power, low latency, etc.)). For example, in certain aspects, operations indicative of low latency higher power are processed on CPUSS 105, DSPSS 107, and longer latency global data (e.g. involving more than just data collected from the current user's mobile device) may be computed with NNPU 909. In certain aspects, cloud edge compute 1001 is tasked with moderate latency data, and cloud core compute 1002 is tasked with the highest latency data. It will be appreciated that in certain aspects, cloud edge 1001 and cloud core compute 1002 may provide exceedingly higher performance than can be accomplished within the single mobile device and may offer the ability to implement deep neural networks with significantly higher precision than can be achieved locally within the mobile device circuit 100.

The neural network model may initially begin with a predetermined number of layers and iterations (e.g., of usage data). These parameters may remain unchanged, or may be adjusted to fewer as time progresses and the model adapts to a particular user's behavior. Validation that the model is accurately predicting the user's behavior may include a period of supervision where the user must confirm that a correct inference has been performed by the neural network. In certain aspects, during validation, the neural network may request that the user confirm a neural network classification (e.g. a bin and/or weight). For example, immediately following a morning commute, the neural network may determine that an activity corresponds to a morning commute, and can request feedback (e.g., from a user (e.g. pop up notification requesting a yes/no confirmation) to confirm that the morning commute activity has occurred during the previous span of time (e.g. in one or more bins). In addition, the neural network classification and the usage data may be shared and analyzed at a higher level (e.g., a cloud edge 1001, or cloud core 1002, etc.) to increase accuracy by considering larger sets of usage data (e.g., multiple users, user grouped strategically (e.g., by location, profession, or other suitable criteria), etc.). Thus, it will be appreciated that leveraging more powerful compute resources can allow deeper neural networks, higher iterations, and or greater precision.

At block 406, one or more bins are generated, and each bin is associated with a weight. In certain aspects, operations 400 end at block 406, and adaptive DRAM controller 170 controls the power to a memory based on at least one bin generated at block 406. For example, a neural network may collect data over a three day period and determine that 3 bins are optimal: a first bin for sleeping with a weight indicative of sleep state between the hours of 11 P.M. and 7 A.M. where the weight is indicative of maximum PASR, PAAR, and/or DPD settings available for a given memory configuration, a second bin for morning and afternoon activity with a weight indicative of light activity and small memory usage between the hours of 7 A.M. and 7 P.M. where the weight is indicative of sparing PASR, PAAR, and/or DPD settings, and a third bin with a weight indicative of high activity and low memory usage between the hours of 7 P.M. and 11 P.M. where the weight is indicative of minimal PASR, PAAR, and/or DPD settings. It will be appreciated that in certain aspects, having only three bins may reduce processing power and increase efficiency as compared to having 24 one hour bins. In other cases, more bins may be optimal for a given computing device.

As explain above, a feedback system may be included in operations 400 as shown in FIG. 4, which may also be performed by circuit 100 in FIG. 1, or another suitable circuit. For example, adaptive DRAM controller 170 may cause a request for feedback to appear on a computing device concurrently with adding a bin at block 406. In certain aspects, if verification is not received, the bin is deleted. For example, the neural network may predict that a computing device would benefit from a bin with a high weight (e.g., a weight indicative of aggressive PASR and DPD settings) when commuting, and a user can confirm the bin and weight (e.g., by confirm they are commuting, and/or confirming an idle state). In other cases, a user may reject the bin and the bin is deleted (e.g., not added) at block 410. Thus, it will be appreciated that further improvements may obtained using the feedback system because anomalous activities or inactivities may be quickly rejected, and predicted activities or inactivates may be confirmed without further need for adaptation. In certain aspects, the feedback system in operations 400 may be included with the operations 200 in FIG. 2, for example, in place of block 208.

Figure 5:
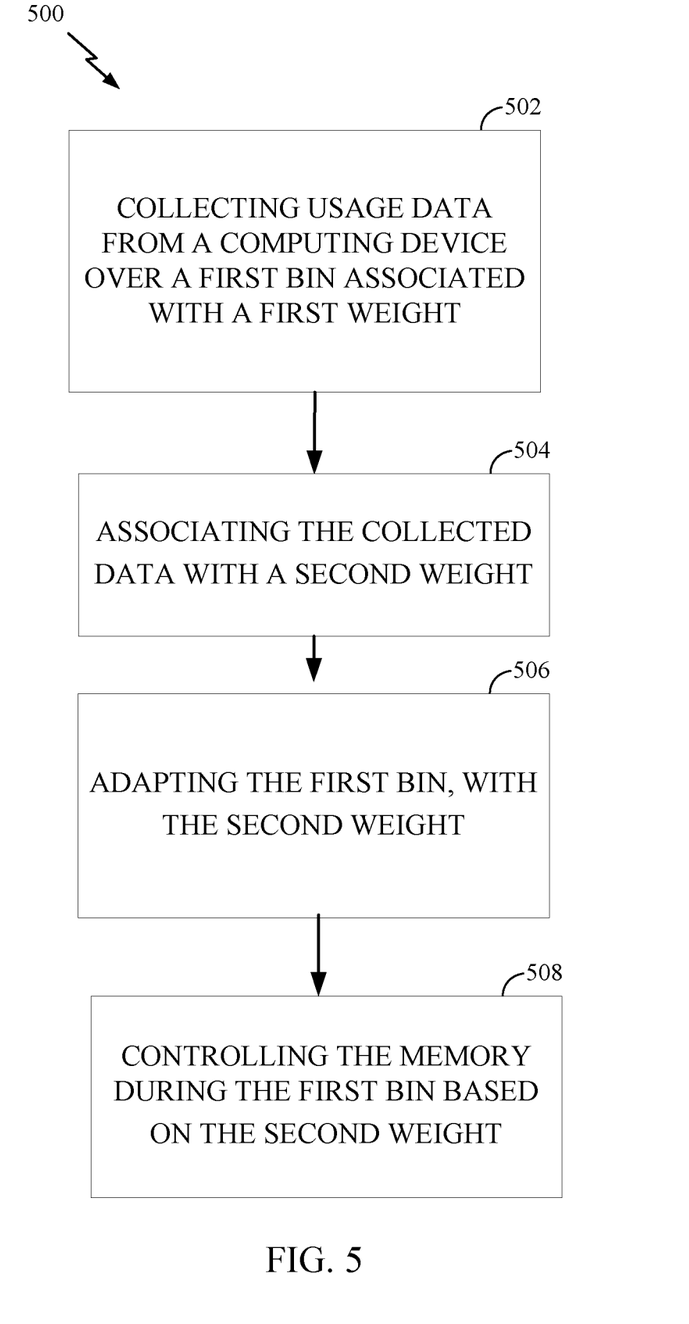
FIG. 5 is a flow chart that illustrates example operations for adaptively controlling a memory, in accordance with certain aspects of the present disclosure.

FIG. 5 is a flow chart of operations 500 for a method of controlling a memory (e.g., DRAM) coupled to a computing device (e.g., circuit 100 in FIG. 1) by an adaptive memory controller (e.g., adaptive DRAM controller 170 in FIG. 1).

At block 502, the adaptive memory controller collects usage data (e.g., monitoring memory usage, application usage, and/or sensor information (e.g., to obtain information on location, movement, battery level, etc.)) over a first bin (i.e., over period of time (e.g., one hour (e.g., between 7 A.M. and 8 A.M.))) from a computing device (e.g., circuit 100 in FIG. 1), wherein the first bin is associated with a first weight. In certain aspects, the first bin and/or the first weight was generated using a setup mode, or preconfigured on the computing device. In other aspects, the first bin and/or the first weight were generated using operations 500.

At block 504, the adaptive memory controller associates the collected data with a second weight. In certain aspects, associating the collected data over the first bin with a second weight may include integrating the data over the first bin (e.g., averaging and/or filtering) and associating the integrated data with a second weight.

At block 506, the adaptive memory controller adapts the first bin (e.g., 7 A.M. and 8 A.M.) based on the second weight. In certain aspects, adapting the first bin based on the second weight includes removing the first weight associated with the first bin and associating the first bin with the second weight.

At block 508, the adaptive memory controller controls the power to the memory during the first bin based on the second weight (e.g., wherein the second weight is indicative of PASR, PAAR, and/or DPD settings). For example, a user of a computing device equipped with an adaptive DRAM controller (e.g., adaptive DRAM controller 170) may sleep from 11 P.M. to 7 A.M. every day, and begin to heavily use their computing device between 7 A.M. and 10 A.M. each day (e.g., to play video games). In this case, the computing device will control power to the memory of the computing device based on a weight is indicative of maximum PASR, PAAR, and DPD settings during the hours of 11 PM. To 7 A.M. and then increase the power to the memory (e.g., based on a weight is indicative of minimal PASR, PAAR, and/or DPD settings) for a 7 A.M. to 10 A.M. bin. If, however, the user begins sleeping in from 7 A.M. to 10 A.M. the adaptive DRAM controller can assign associate the 7 A.M. to 10 A.M. bin with a weight indicative of maximal PASR, PAAR, and/or DPD settings, thereby preventing the computing device from increasing power during the 7 A.M. to 10 A.M. bin. In certain aspects, the 7 A.M. to 10 A.M. bin may then be merged with the 11 PM. To 7 A.M. bin. In other aspects, the 11 PM. To 7 A.M. is not merged.

In some configurations, the term(s) 'communicate,' 'communicating,' and/or 'communication' may refer to 'receive,' 'receiving,' 'reception,' and/or other related or suitable aspects without necessarily deviating from the scope of the present disclosure. In some configurations, the term(s) 'communicate,' 'communicating,' 'communication,' may refer to 'transmit,' 'transmitting,' 'transmission,' and/or other related or suitable aspects without necessarily deviating from the scope of the present disclosure.

The word "power down", "power on", "reduce power", or "increase power" may be used to describe the change of refresh for a portion of memory caused by changing the PASR, PAAR, and/or DPD settings.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. For instance, a first object may be coupled to a second object even though the first object is never directly physically in contact with the second object. The terms "circuit" and "circuitry" are used broadly, and intended to include both hardware implementations of electrical devices and conductors that, when connected and configured, enable the performance of the functions described in the present disclosure, without limitation as to the type of electronic circuits.

One or more of the components, steps, features and/or functions illustrated herein may be rearranged and/or combined into a single component, step, feature or function or embodied in several components, steps, or functions. Additional elements, components, steps, and/or functions may also be added without departing from novel features disclosed herein. The apparatus, devices, and/or components illustrated herein may be configured to perform one or more of the methods, features, or steps described herein. The novel algorithms described herein may also be efficiently implemented in software and/or embedded in hardware.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

These apparatus and methods described in the detailed description and illustrated in the accompanying drawings by various blocks, modules, components, circuits, steps, processes, algorithms, etc. (collectively referred to as "elements"). These elements may be implemented using hardware, software, or combinations thereof. Whether such elements are implemented as hardware or software depends upon the particular application and design constraints imposed on the overall system.

By way of example, an element, or any portion of an element, or any combination of elements may be implemented with a "processing system" that includes one or more processors. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software modules, applications, software applications, software packages, firmware, routines, subroutines, objects, executables, threads of execution, procedures, functions, etc., whether referred to as software, firmware, middleware, microcode, hardware description language, or otherwise.

Accordingly, in one or more exemplary embodiments, the functions described may be implemented in hardware, software, or combinations thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise RAM, ROM, EEPROM, PCM (phase change memory), flash memory, CD-ROM or other optical disc storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray disc. Combinations of the above should also be included within the scope of computer-readable media.

What is claimed is:

1. A method of controlling a memory of a computing device by an adaptive memory controller, the method comprising:
    collecting usage data from the computing device over an instance of a first bin corresponding to a repeating time period, wherein the first bin is associated with a first weight based on previously collected usage data of the computing device over a previous instance of the first bin, wherein the first weight maps to one or more of a first partial array self-refresh (PASR) setting, a first partial array automatic refresh (PAAR) setting, and a first deep power down (DPD) setting, wherein the first weight is a numerical value that controls a number of portions of the memory to which to apply power management;
    associating the collected usage data over the instance of the first bin with a second weight;
    associating the first bin with the second weight based on the second weight being different than the first weight, wherein the second weight maps to one or more of a second PASR setting, a second PAAR setting, and a second DPD setting, wherein the second weight is a numerical value that controls a number of portions of the memory to which to apply power management, wherein the memory is configured to be refreshed during the next instance of the first bin based on the second weight prior to the start of the next instance of the first bin; and
    controlling a refresh of the memory during the next instance of the first bin based on the second weight by utilizing the one or more of the second PASR setting, the second PAAR setting, and the second DPD setting to determine a refresh rate.

2. The method of claim 1, wherein associating the collected usage data over the instance of the first bin with the second weight is based in part on memory usage of the computing device during the first bin.

3. The method of claim 1, wherein associating the collected usage data over the instance of the first bin with the second weight is based in part on information from one or more sensors of the computing device during the first bin.

4. The method of claim 1, wherein the collected usage data includes data indicative a location, a movement, or a battery level.

5. The method of claim 1, wherein the collected usage data is integrated, and wherein integrating the data comprises one or more of averaging or filtering the collected usage data.

6. The method of claim 1, further comprising:
    collecting usage data from the computing device over a second bin, wherein the second bin is associated with a third weight, wherein the third weight is indicative of one or more of a third PASR setting, a third PAAR setting, and a third deep power down DPD setting;
    associating the collected usage data with a fourth weight, wherein the fourth weight is indicative of one or more of a fourth PASR setting, a fourth PAAR setting, and a fourth DPD setting;
    adapting the second bin based on the fourth weight; and
    controlling the memory during the next second bin based on the fourth weight.

7. A method of controlling a memory of a computing device by an adaptive memory controller, the method comprising:
collecting a first data set from the computing device over at least an instance of a first bin, wherein the first data set comprises usage data;
associating the collected first data set with a first weight, wherein the first weight is indicative of one or more of a first partial array self-refresh (PASR), a first partial array auto refresh (PAAR) setting, and a first deep power down (DPD) setting, wherein the first weight is a numerical value that controls a number of portions of the memory to which to apply power management, wherein the memory is configured to be refreshed during the next instance of the first bin based on the first weight prior to the start of the next instance of the first bin; and
controlling a refresh of the memory during the next instance of the first bin based on the first weight by utilizing the one or more of the first partial array self-refresh (PASR), the first partial array auto refresh (PAAR) setting, and the first deep power down (DPD) setting to determine a refresh rate.

8. The method of claim 7, wherein the first bin length is predetermined.

9. The method of claim 8, where the first bin length is one hour.

10. The method of claim 7, wherein associating the collected first data set with the first weight is based in part on memory usage of the computing device during the instance of the first bin.

11. The method of claim 7, wherein associating the collected first data set with the first weight is based in part on information from one or more sensors of the computing device during the instance of the first bin.

12. The method of claim 7, wherein the collected first data set includes data indicative a location, a movement, or a battery level.

13. The method of claim 7, comprising:
collecting a second data set from the computing device over the next instance of the first bin;
determining if the second data set is indicative of the first weight; and
confirming the first bin when the second data set is indicative of the first weight, and
deleting the first bin when the second data set is indicative of a weight other than the first weight.

14. The method of claim 13, wherein the next instance of the first bin is on a different day than the instance of the first bin.

15. The method of claim 7, further comprising:
processing the collected first data set with a neural network and generating the at least one instance of the first bin based on the first data set.

16. The method of claim 15, comprising:
processing the collected first data set with a neural network and generating a second bin associated with a second weight, wherein the second bin is associated with a second weight, and wherein the second weight is indicative of one or more of a second PASR setting, a second PAAR setting, and a second DPD setting; and
controlling the memory in part based on the second bin.

17. The method of claim 15, wherein generating at the least one instance of the first bin based on the first data set is verified by feedback received at the computing device; and
when the feedback is indicative of a verification, controlling the power to the memory based on the at least one instance of the first bin; and
when the memory power setting is not verified, removing the at least one instance of the first bin.

18. A non-transitory medium comprising instructions that when executed by a processor of a computing system cause the computing system to execute a method of controlling a memory of a computing device by an adaptive memory controller, the method comprising:
collecting usage data from the computing device over an instance of a first bin corresponding to a repeating time period, wherein the first bin is associated with a first weight based on previously collected usage data of the computing device over a previous instance of the first bin, wherein the first weight maps to one or more of a first partial array self-refresh (PASR) setting, a first partial array automatic refresh (PAAR) setting, and a first deep power down (DPD) setting, wherein the first weight is a numerical value that controls a number of portions of the memory to which to apply power management;
associating the collected usage data over the instance of the first bin with a second weight;
associating the first bin with the second weight based on the second weight being different than the first weight, wherein the second weight maps to one or more of a second PASR setting, a second PAAR setting, and a second DPD setting, wherein the second weight is a numerical value that controls a number of portions of the memory to which to apply power management, wherein the memory is configured to be refreshed during the next instance of the first bin based on the second weight prior to the start of the next instance of the first bin; and
controlling a refresh of the memory during the next instance of the first bin based on the second weight by utilizing the one or more of the second PASR setting, the second PAAR setting, and the second DPD setting to determine a refresh rate.

19. The non-transitory medium of claim 18, wherein associating the collected usage data with the second weight is based in part on memory usage of the computing device during the first bin.

20. The non-transitory medium of claim 18, wherein associating the collected usage data with the second weight is based in part on information from one or more sensors of the computing device during the first bin.

* * * * *